US012575403B2

(12) United States Patent
Chang et al.

(10) Patent No.: US 12,575,403 B2
(45) Date of Patent: Mar. 10, 2026

(54) INTERCONNECT STRUCTURE

(71) Applicant: Powerchip Semiconductor Manufacturing Corporation, Hsinchu (TW)

(72) Inventors: Shou-Zen Chang, Hsinchu (TW); Mei Ling Ho, Hsinchu County (TW); Tien-Lu Lin, Hsinchu (TW); Ming-Han Liao, Hsinchu (TW); Chia-Ming Wu, Hsinchu (TW); Jui-Neng Tu, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 518 days.

(21) Appl. No.: 17/943,224

(22) Filed: Sep. 13, 2022

(65) Prior Publication Data

US 2024/0055351 A1 Feb. 15, 2024

(30) Foreign Application Priority Data

Aug. 11, 2022 (TW) ................................. 111130161

(51) Int. Cl.
H01L 23/528 (2006.01)
H01L 23/522 (2006.01)
*H01L 23/532* (2006.01)

(52) U.S. Cl.
CPC ...... H01L 23/5283 (2013.01); H01L 23/5226 (2013.01); *H01L 23/53209* (2013.01); *H01L 23/53214* (2013.01); *H01L 23/53223* (2013.01); *H01L 23/53238* (2013.01);
(Continued)

(58) Field of Classification Search
CPC ............. H01L 23/5283; H01L 23/5226; H01L 23/53209; H01L 23/53214; H01L 23/53223; H01L 23/53238; H01L 23/53242; H01L 23/53252; H01L 23/53257; H01L 23/53266; H01L 23/522; H01L 23/5386; H01L 23/481
See application file for complete search history.

(56) References Cited

U.S. PATENT DOCUMENTS

| | | | |
|---|---|---|---|
| 5,338,398 A | 8/1994 | Szwejkowski et al. |
| 5,609,775 A | 3/1997 | Liu |
| 5,753,533 A | 5/1998 | Saito |

(Continued)

FOREIGN PATENT DOCUMENTS

| | | | |
|---|---|---|---|
| TW | 201533844 | * | 9/2015 |
| TW | 201923908 | | 6/2019 |
| WO | WO-2018111289 A1 * | 6/2018 |

OTHER PUBLICATIONS

Espacenet machine translation of TW 201533844 (Year: 2015).*
"Office Action of Taiwan Counterpart Application", issued on Jul. 26, 2023, p. 1-p. 7.

*Primary Examiner* — Evan G Clinton
*Assistant Examiner* — Corbyn D Mellinger
(74) *Attorney, Agent, or Firm* — JCIPRNET

(57) ABSTRACT

An interconnect structure including a dielectric structure, plugs, and conductive lines is provided. The dielectric structure is disposed on a substrate. The plugs are disposed in the dielectric structure. The conductive lines are disposed in the dielectric structure and are electrically connected to the plugs. The sidewall of at least one of the conductive lines is in direct contact with the dielectric structure.

18 Claims, 15 Drawing Sheets

(52) U.S. Cl.
CPC .. *H01L 23/53242* (2013.01); *H01L 23/53252* (2013.01); *H01L 23/53257* (2013.01); *H01L 23/53266* (2013.01)

(56) References Cited

U.S. PATENT DOCUMENTS

| | | | |
|---|---|---|---|
| 6,461,974 | B1 | 10/2002 | Ni et al. |
| 6,579,806 | B2 | 6/2003 | Nallan et al. |
| 11,004,794 | B2 | 5/2021 | Tsai et al. |
| 2002/0106895 | A1 | 8/2002 | Chung |
| 2003/0092280 | A1 | 5/2003 | Lee et al. |
| 2017/0110368 | A1 | 4/2017 | Yu et al. |
| 2019/0148225 | A1* | 5/2019 | Chen ..................... H01L 23/485 |
| | | | 257/384 |
| 2022/0223535 | A1* | 7/2022 | Huang ............. H01L 21/76816 |

* cited by examiner

INTERCONNECT STRUCTURE

CROSS-REFERENCE TO RELATED APPLICATION

This application claims the priority benefit of Taiwan application serial no. 111130161, filed on Aug. 11, 2022. The entirety of the above-mentioned patent application is hereby incorporated by reference herein and made a part of this specification.

BACKGROUND

Technical Field

The invention relates to an integrated circuit structure, and particularly relates to an interconnect structure.

Description of Related Art

As the size of the electronic device continues to shrink, the pitch of the interconnect structure shrinks as well. When the pitch of the interconnect structure is reduced, the line width of the conductive line in the interconnect structure is also reduced, which increases the resistance of the conductive line. In the current interconnect structure, in the space where the conductive line is to be formed, the conductive line and the barrier layer between the conductive line and the dielectric layer are formed. Since the barrier layer occupies a portion of the space where the conductive line is to be formed, the line width of the conductive line is further reduced, which greatly increases the resistance of the conductive line.

SUMMARY

The invention provides an interconnect structure, which can effectively reduce the resistance of the conductive line.

The invention proposes an interconnect structure, which includes a dielectric structure, plugs, and conductive lines. The dielectric structure is disposed on a substrate. The plugs are disposed in the dielectric structure. The conductive lines are disposed in the dielectric structure and are electrically connected to the plugs. The sidewall of at least one of the conductive lines is in direct contact with the dielectric structure.

According to an embodiment of the invention, in the interconnect structure, the minimum pitch of the interconnect structure may be less than or equal to 54 nanometers (nm).

According to an embodiment of the invention, in the interconnect structure, the plugs and the conductive lines may be alternately stacked on the substrate.

According to an embodiment of the invention, in the interconnect structure, the dielectric structure may be a multilayer structure.

According to an embodiment of the invention, in the interconnect structure, the sidewall of at least one of the plugs may be in direct contact with the dielectric structure.

According to an embodiment of the invention, in the interconnect structure, the sidewalls of all the plugs may be in direct contact with the dielectric structure.

According to an embodiment of the invention, in the interconnect structure, the sidewall of the plug is in direct contact with the dielectric structure, and the material of the plug is, for example, ruthenium (Ru), tungsten (W), or palladium (Pd).

According to an embodiment of the invention, in the interconnect structure, the sidewall of the plug is not in direct contact with the dielectric structure, and the material of the plug is, for example, copper (Cu), cobalt (Co), ruthenium (Ru), Tungsten (W), or Palladium (Pd).

According to an embodiment of the invention, in the interconnect structure, the material of the conductive line is, for example, ruthenium (Ru), tungsten (W), silver (Ag), gold (Au), aluminum (Al), molybdenum (Mo), rhodium (Rh), palladium (Pd), copper (Cu), or cobalt (Co).

According to an embodiment of the invention, the interconnect structure may further include a barrier layer. The barrier layer is disposed between the plug and the dielectric structure.

According to an embodiment of the invention, in the interconnect structure, the barrier layer may be further disposed directly below the plug. The cross-sectional shape of the barrier layer may be a U-shape.

According to an embodiment of the invention, in the interconnect structure, the material of the barrier layer is, for example, tantalum (Ta), tantalum nitride (TaN), titanium (Ti), titanium nitride (TiN), ruthenium (Ru), or a combination thereof.

According to an embodiment of the invention, the interconnect structure may further include a barrier layer. The barrier layer is disposed between the conductive line and the plug.

According to an embodiment of the invention, in the interconnect structure, the cross-sectional shape of the barrier layer may be a linear shape.

According to an embodiment of the invention, in the interconnect structure, the material of the barrier layer is, for example, tantalum (Ta), tantalum nitride (TaN), titanium (Ti), titanium nitride (TiN), ruthenium (Ru), titanium tungsten (TiW), tungsten nitride (WN), or a combination thereof.

According to an embodiment of the invention, in the interconnect structure, the sidewalls of all the conductive lines may be in direct contact with the dielectric structure.

According to an embodiment of the invention, in the interconnect structure, the conductive lines include a conductive line whose sidewall is not in direct contact with the dielectric structure.

According to an embodiment of the invention, the interconnect structure may further include a barrier layer. The barrier layer is disposed between the conductive line whose sidewall is not in direct contact with the dielectric structure and the dielectric structure.

According to an embodiment of the invention, in the interconnect structure, the barrier layer may be further disposed directly below the conductive line whose sidewall is not in direct contact with the dielectric structure. The cross-sectional shape of the barrier layer may be a U-shape.

According to an embodiment of the invention, in the interconnect structure, the material of the barrier layer is, for example, tantalum (Ta), tantalum nitride (TaN), titanium (Ti), titanium nitride (TiN), ruthenium (Ru), titanium tungsten (TiW), tungsten nitride (WN), or a combination thereof.

Based on the above description, in the interconnect structure according to the invention, the sidewall of at least one of the conductive lines is in direct contact with the dielectric structure. That is, there is no barrier layer between the sidewall of at least one of the conductive lines and the dielectric structure, so the conductive line whose sidewall is in direct contact with the dielectric structure can have a larger line width, thereby effectively reducing the resistance of the conductive line.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
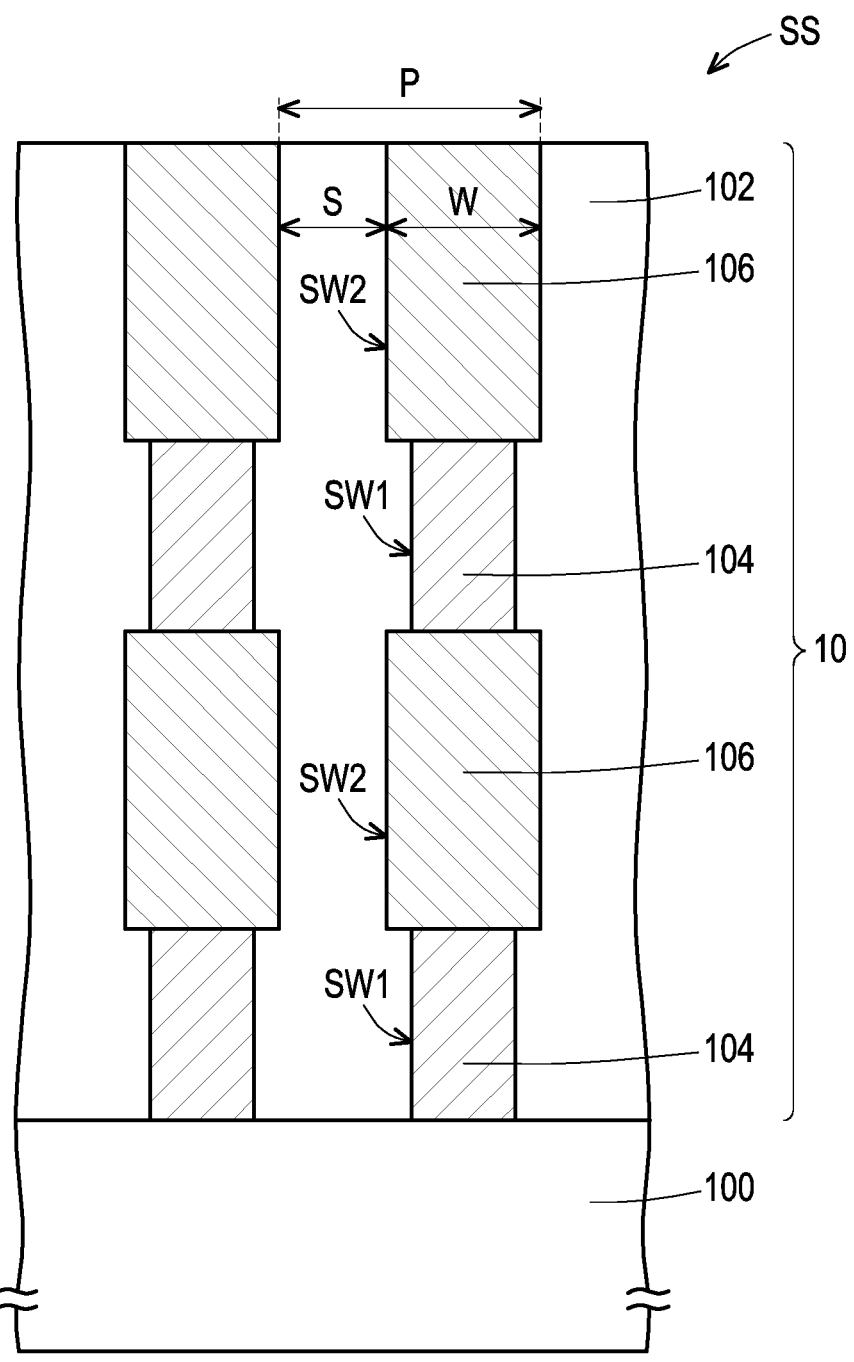
FIG. 1 is a cross-sectional view illustrating an interconnect structure according to some embodiments of the invention.

FIG. 1 is a cross-sectional view illustrating an interconnect structure according to some embodiments of the invention.

Referring to FIG. 1, an interconnect structure 10 includes a dielectric structure 102, plugs 104, and conductive lines 106. In some embodiments, the minimum pitch P of the interconnect structure 10 may be less than or equal to 54 nm. In some embodiments, the minimum pitch P of the interconnect structure 10 may be less than or equal to 46 nm. In some embodiments, the minimum pitch P of the interconnect structure 10 may be less than or equal to 42 nm. In some embodiments, the minimum pitch P of the interconnect structure 10 may be less than or equal to 40 nm. In some embodiments, the minimum pitch P of the interconnect structure 10 may be less than or equal to 38 nm. In some embodiments, the pitch may be defined as the sum of the line width and the line spacing. For example, as shown in FIG. 1, the minimum pitch P may be the sum of the line width W and the line spacing S.

The dielectric structure 102 is disposed on the substrate 100. The substrate 100 may be a semiconductor substrate such as a silicon substrate. In addition, although not shown in FIG. 1, the substrate 100 may have required components thereon, such as semiconductor devices (e.g., active devices and/or passive devices) and/or other dielectric structures, and the description thereof is omitted here. In some embodiments, the interconnect structure 10 may be used to be electrically connected to the semiconductor device (not shown) on the substrate 100. In some embodiments, the dielectric structure 102 may be a multilayer structure. The material of the dielectric structure 102 is, for example, silicon oxide, silicon nitride, silicon oxynitride (SiON), silicon carbide nitride (SiCN), a low dielectric constant material, or a combination thereof.

The plugs 104 are disposed in the dielectric structure 102. In some embodiments, the plug 104 may be a via plug or a contact plug. In some embodiments, the sidewall SW1 of at least one of the plugs 104 may be in direct contact with the dielectric structure 102. In the present embodiment, the sidewall SW1 of all the plugs 104 may be in direct contact with the dielectric structure 102, but the invention is not limited thereto. In some embodiments, when the sidewall SW1 of the plug 104 is in direct contact with the dielectric structure 102, the material of the plug 104 is, for example, ruthenium (Ru), tungsten (W), or palladium (Pd). Furthermore, the number of the plugs 104 in the interconnect structure 10 is not limited to the number in FIG. 1. One of ordinary skill in the art may determine the number of the plugs 104 in the interconnect structure 10 according to the product requirement.

The conductive lines 106 are disposed in the dielectric structure 102 and are electrically connected to the plugs 104. The plugs 104 and the conductive lines 106 may be alternately stacked on the substrate 100. The sidewall SW2 of at least one of the conductive lines 106 is in direct contact with the dielectric structure 102. In the present embodiment, the sidewalls SW2 of all the conductive lines 106 may be in direct contact with the dielectric structure 102, but the invention is not limited thereto. The material of the conductive line 106 is, for example, ruthenium (Ru), tungsten (W), silver (Ag), gold (Au), aluminum (Al), molybdenum (Mo), rhodium (Rh), palladium (Pd), copper (Cu), or cobalt (Co). In addition, the number of the conductive lines 106 in the interconnect structure 10 is not limited to the number in FIG. 1. One of ordinary skill in the art may determine the number of the conductive lines 106 in the interconnect structure 10 according to the product requirement.

In a semiconductor structure SS of FIG. 1, the number of the interconnect structures 10 is, for example, two, but the invention is not limited thereto. One of ordinary skill in the art may determine the number of the interconnect structures 10 according to the product requirement. As long as the semiconductor structure SS has at least one interconnect structure 10, it falls within the scope of the invention.

Based on the above embodiments, in the interconnect structure 10, the sidewall SW2 of at least one of the conductive lines 106 is in direct contact with the dielectric structure 102. That is, there is no barrier layer between the sidewall SW2 of at least one of the conductive lines 106 and the dielectric structure 102, so the conductive line 106 whose sidewall is in direct contact with the dielectric structure 102 can have a larger line width, thereby effectively reducing the resistance of the conductive line 106.

Figure 2:
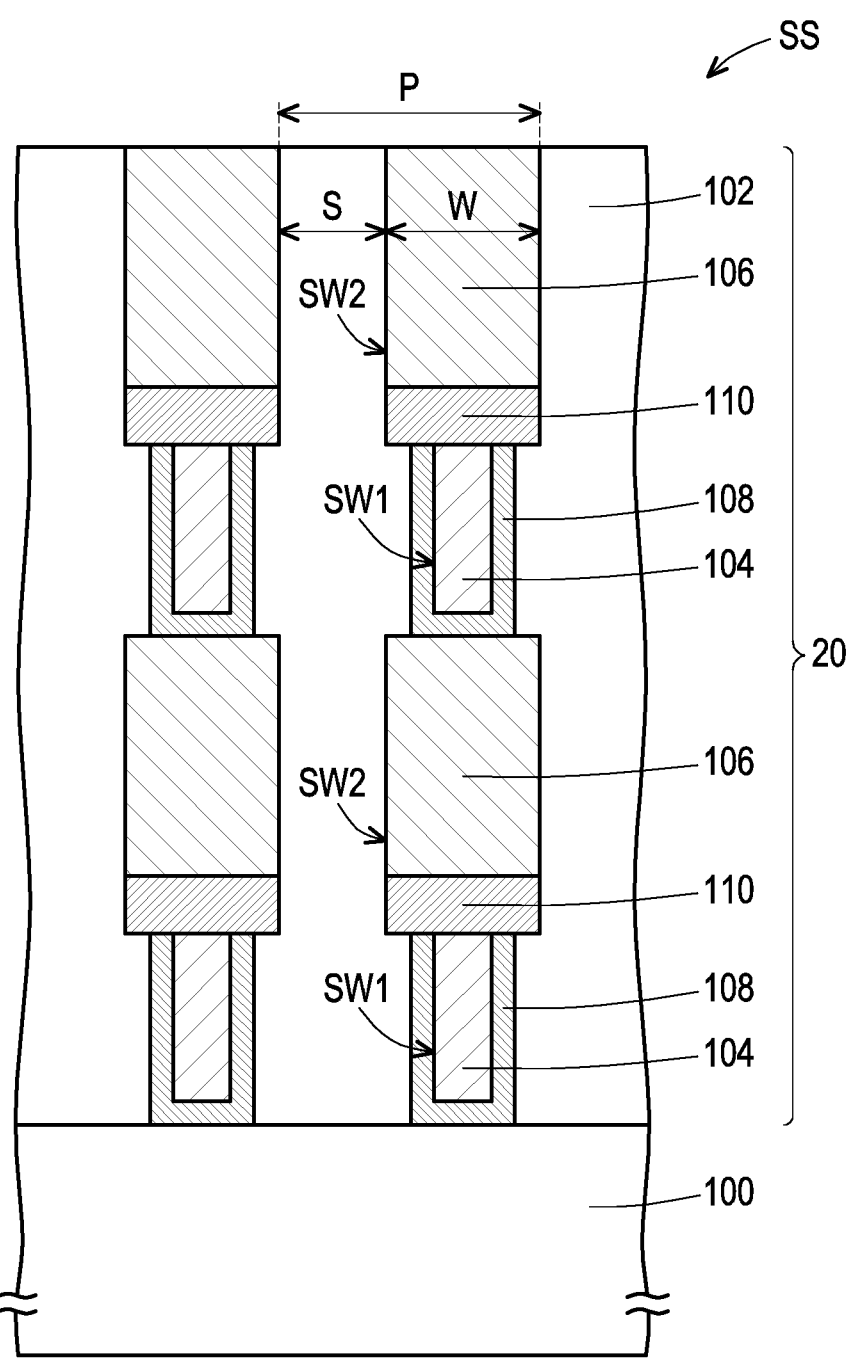
FIG. 2 is a cross-sectional view illustrating an interconnect structure according to other embodiments of the invention.

FIG. 2 is a cross-sectional view illustrating an interconnect structure according to other embodiments of the invention.

Referring to FIG. 1 and FIG. 2, the difference between an interconnect structure 20 of FIG. 2 and the interconnect structure 10 of FIG. 1 is as follows. In the interconnect structure 20, the sidewall SW1 of at least one of the plugs 104 is not in direct contact with the dielectric structure 102. In the present embodiment, in the interconnect structure 20, the sidewalls SW1 of all the plugs 104 are not in direct contact with the dielectric structure 102, but the invention is not limited thereto. In some embodiments, when the sidewall SW1 of the plug 104 is not in direct contact with the dielectric structure 102, the material of the plug 104 is, for example, copper (Cu), cobalt (Co), ruthenium (Ru), tungsten (W), or palladium (Pd).

The interconnect structure 20 may further include a barrier layer 108. The barrier layer 108 is disposed between the plug 104 and the dielectric structure 102, thereby isolating the sidewall SW1 of the plug 104 from the dielectric structure 102. In some embodiments, the barrier layer 108 may be further disposed directly below the plug 104. In some embodiments, the cross-sectional shape of the barrier layer 108 may be a U-shape. The material of the barrier layer 108 is, for example, tantalum (Ta), tantalum nitride (TaN), titanium (Ti), titanium nitride (TiN), ruthenium (Ru), or a combination thereof.

The interconnect structure 20 may further include a barrier layer 110. The barrier layer 110 is disposed between the conductive line 106 and the plug 104. In some embodiments, the cross-sectional shape of the barrier layer 110 may be a linear shape. The material of the barrier layer 110 is, for example, tantalum (Ta), tantalum nitride (TaN), titanium (Ti), titanium nitride (TiN), ruthenium (Ru), titanium tungsten (TiW), tungsten nitride (WN), or a combination thereof.

In addition, in the interconnect structure 10 of FIG. 1 and the interconnect structure 20 of FIG. 2, the same or similar components are denoted by the same reference symbols, and the description thereof is omitted.

Based on the above embodiments, in the interconnect structure 20, the sidewall SW2 of at least one of the conductive lines 106 is in direct contact with the dielectric structure 102. That is, there is no barrier layer between the sidewall SW2 of at least one of the conductive lines 106 and the dielectric structure 102, so the conductive line 106 whose sidewall is in direct contact with the dielectric structure 102 can have a larger line width, thereby effectively reducing the resistance of the conductive line 106.

Figure 3:
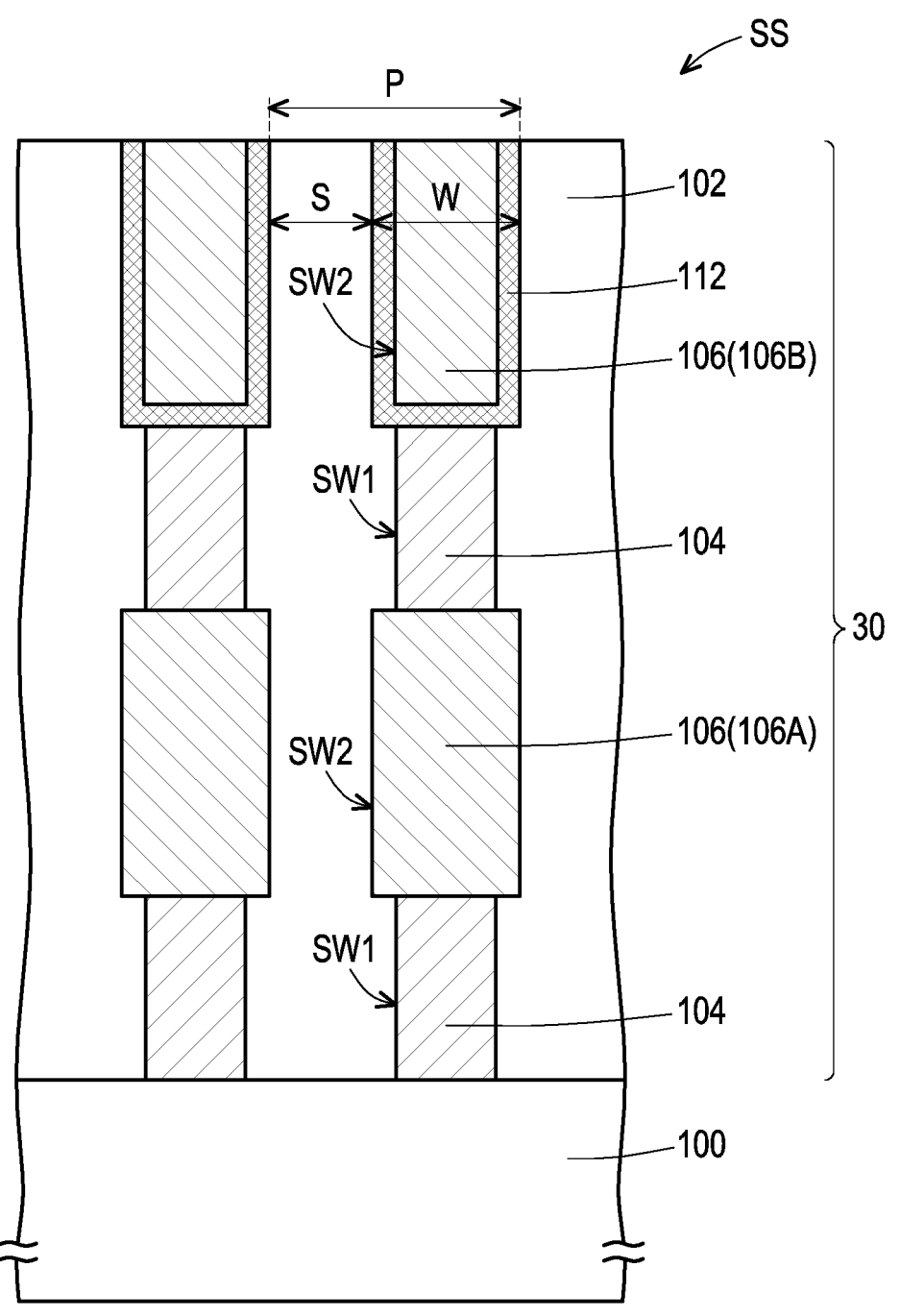
FIG. 3 is a cross-sectional view illustrating an interconnect structure according to other embodiments of the invention.
Figure 4A:
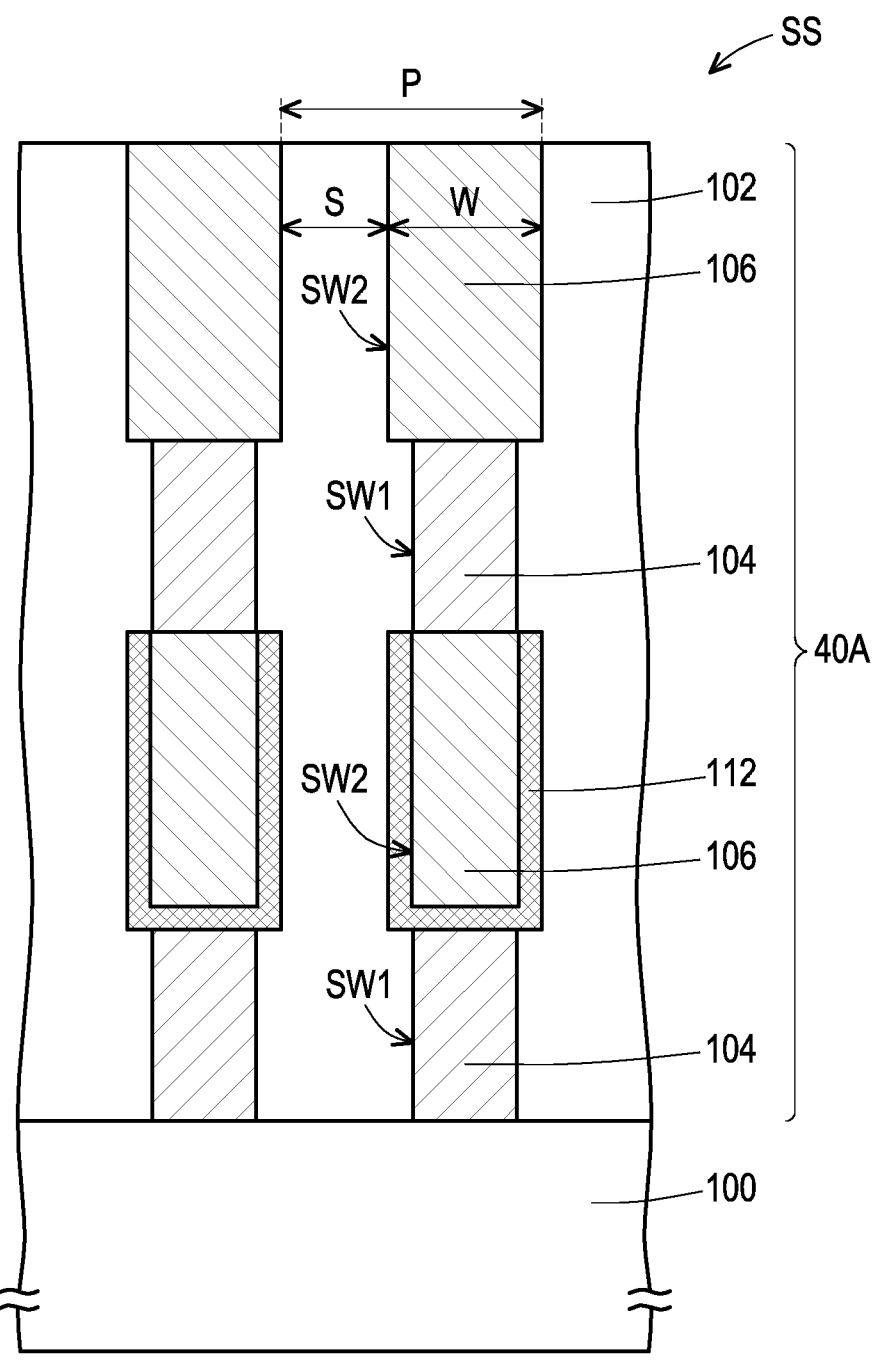
FIG. 4A to FIG. 4L are cross-sectional views illustrating interconnect structures according to other embodiments of the invention.
Figure 4B:
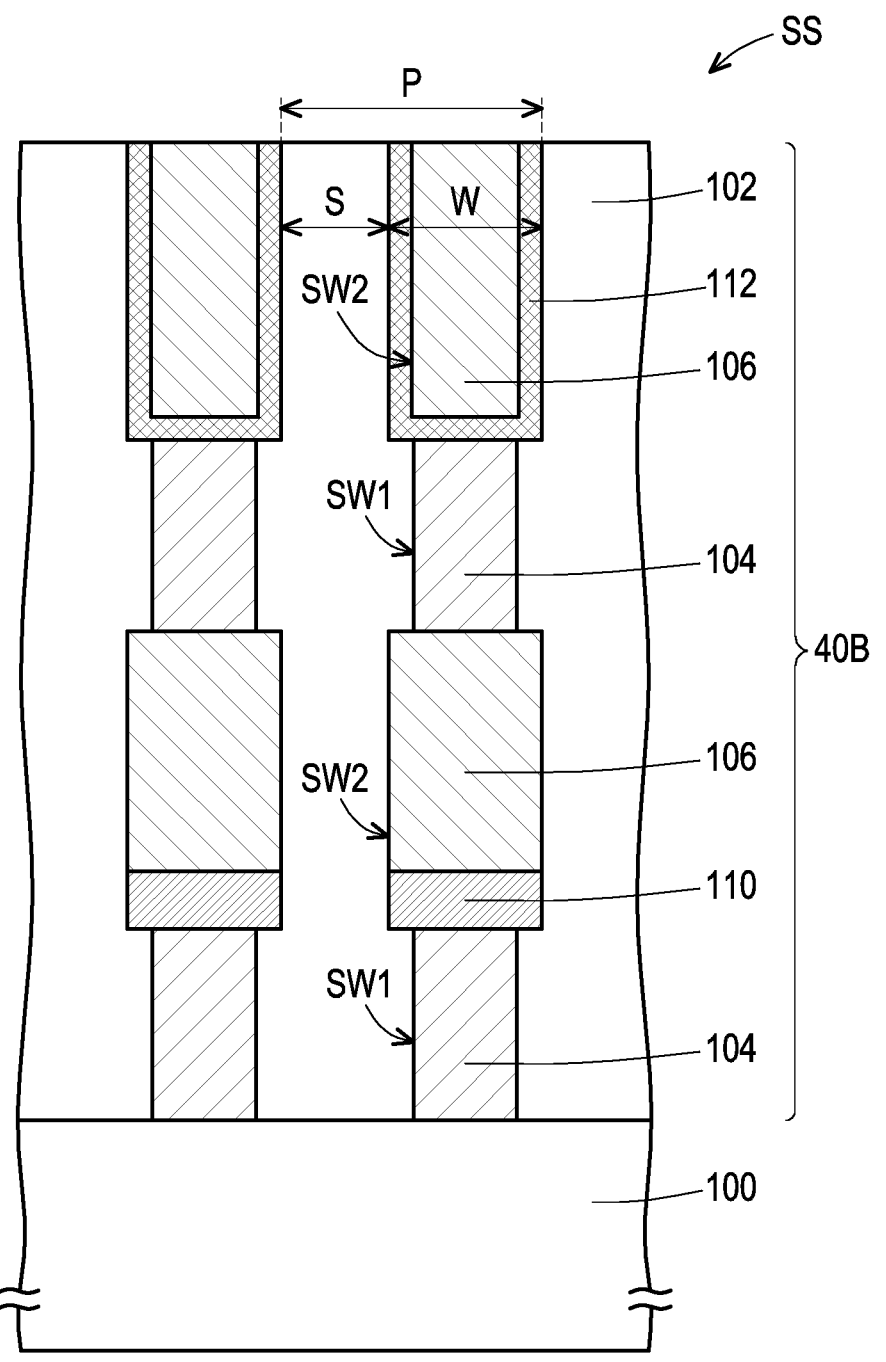
Figure 4C:
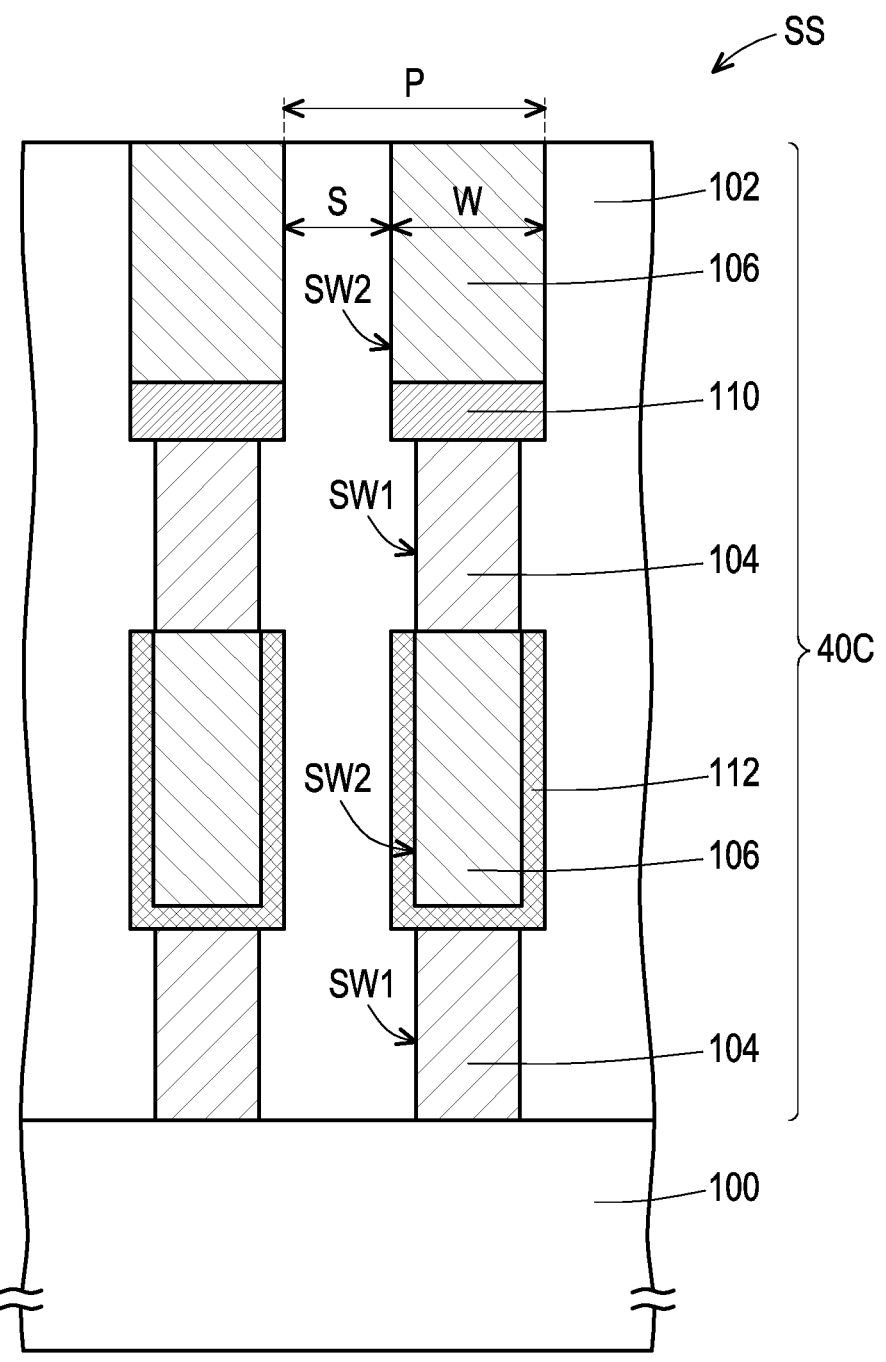
Figure 4D:
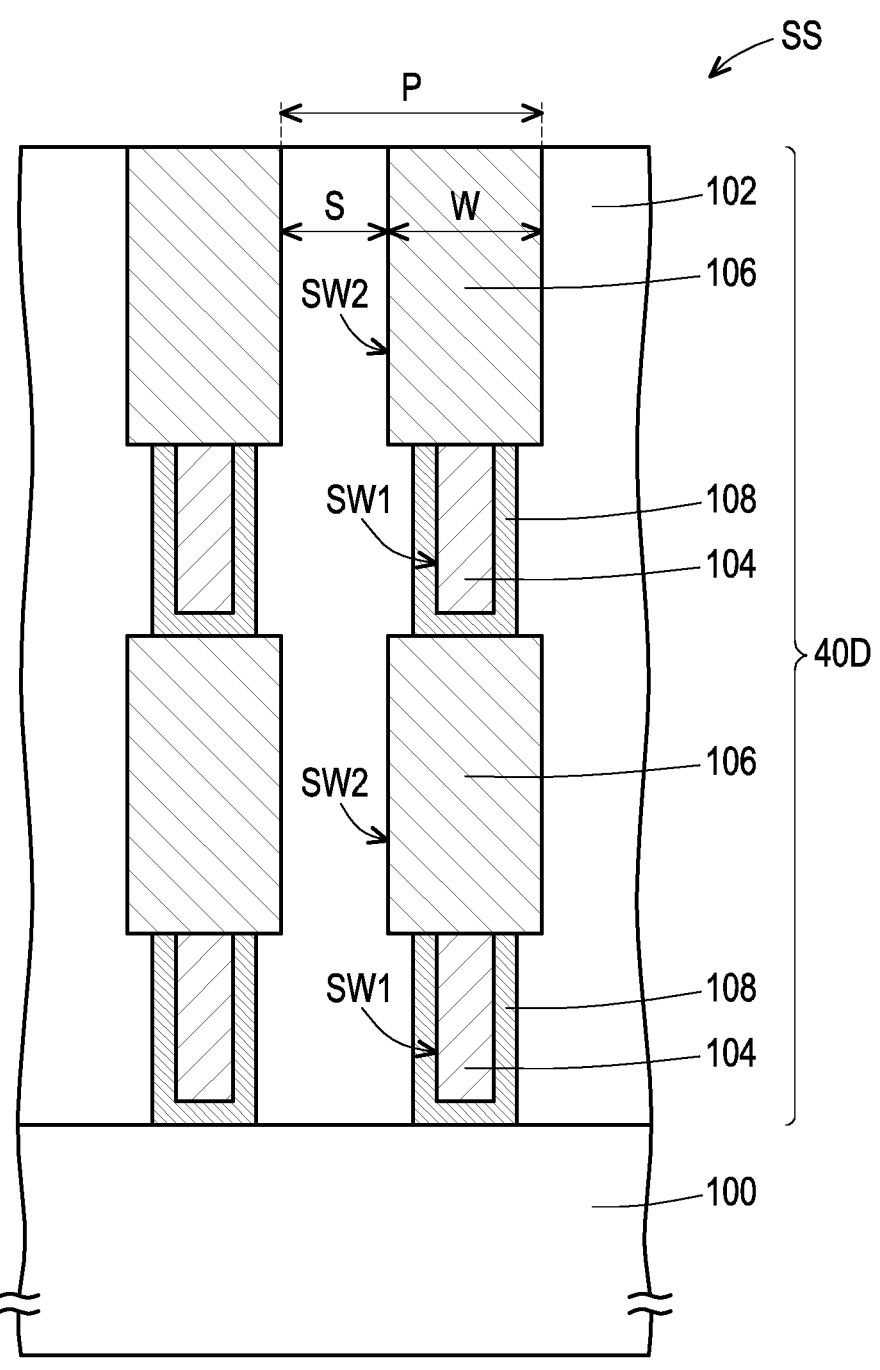
Figure 4E:
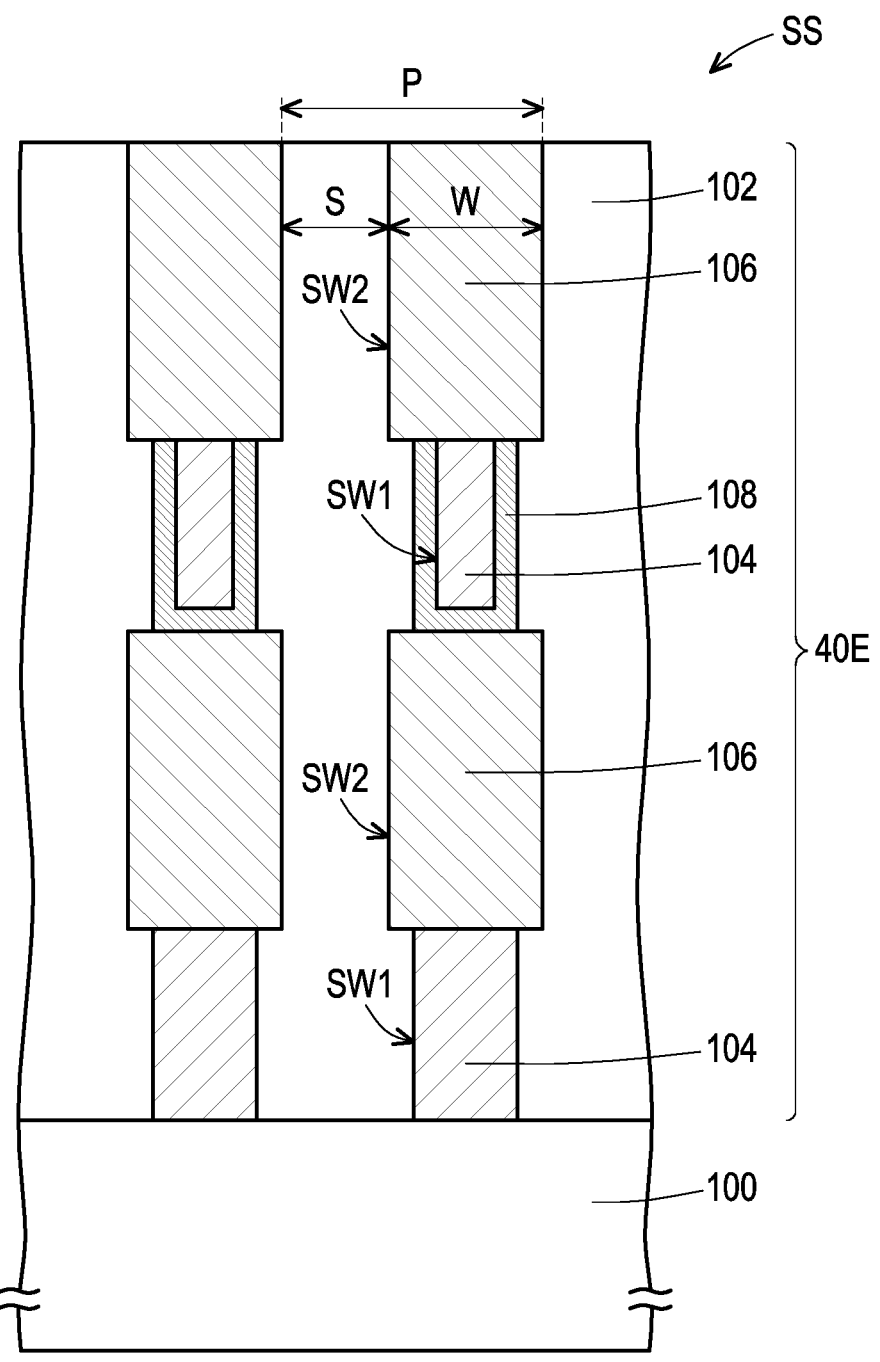
Figure 4F:
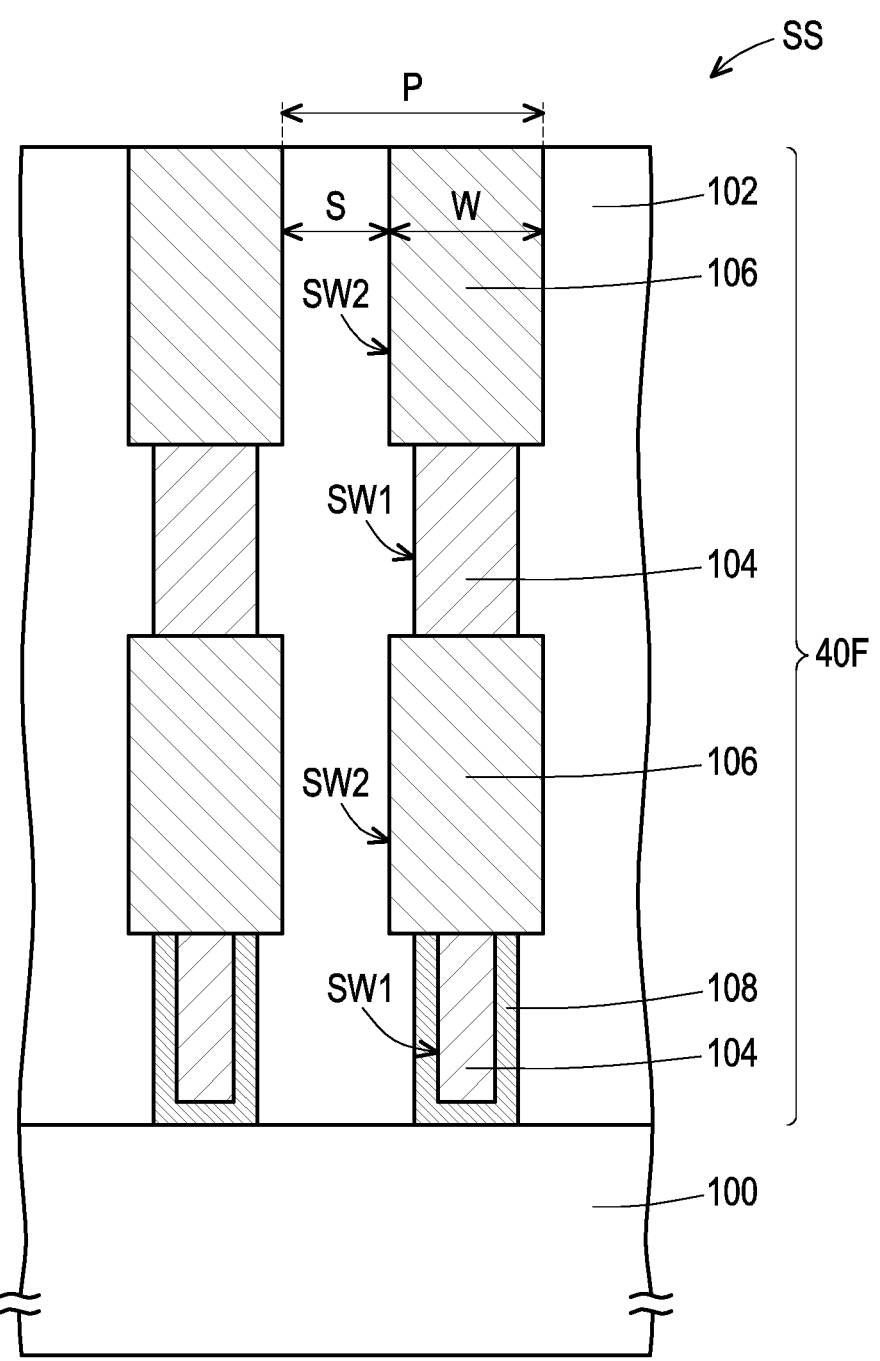
Figure 4G:
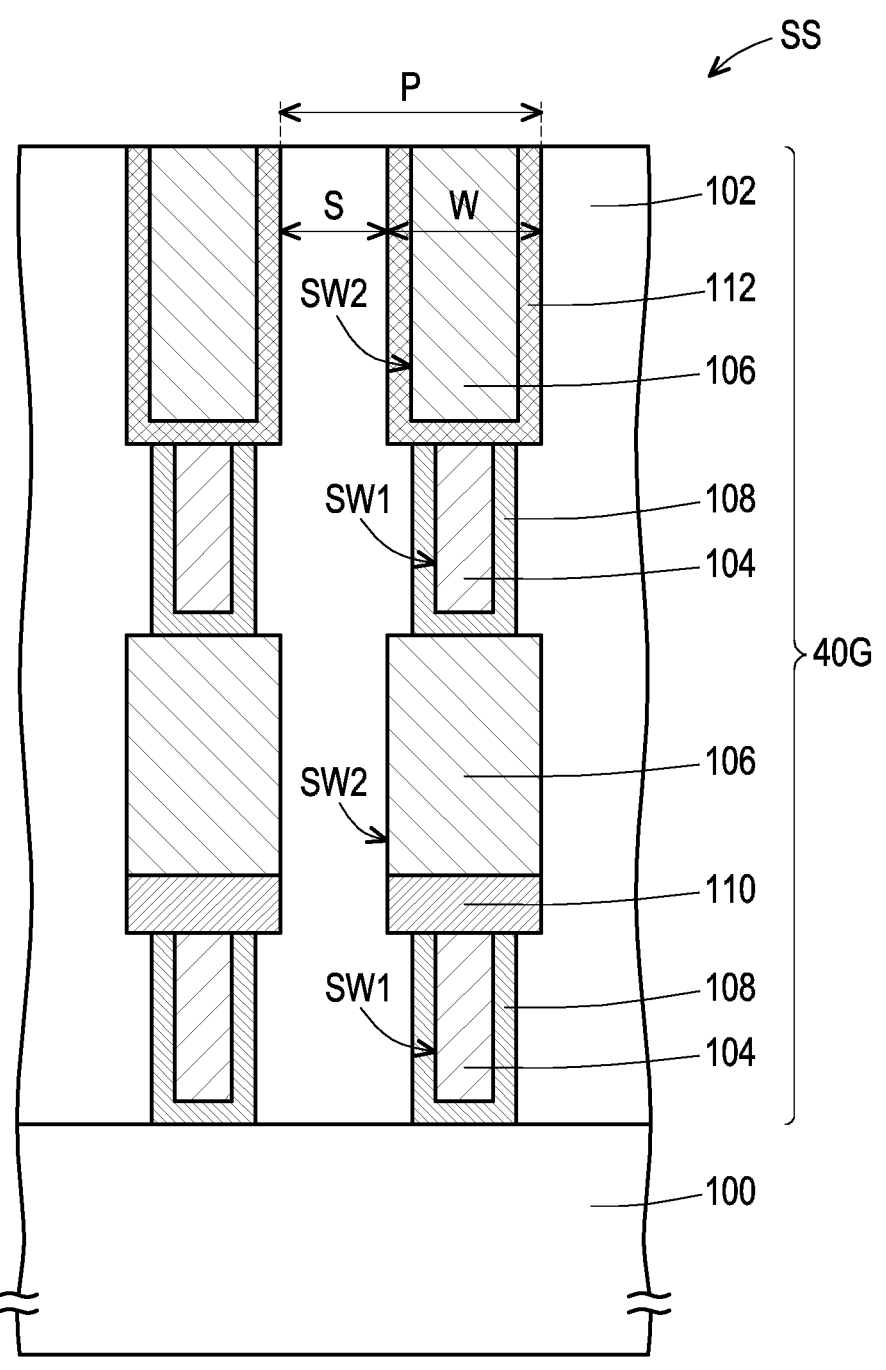
Figure 4H:
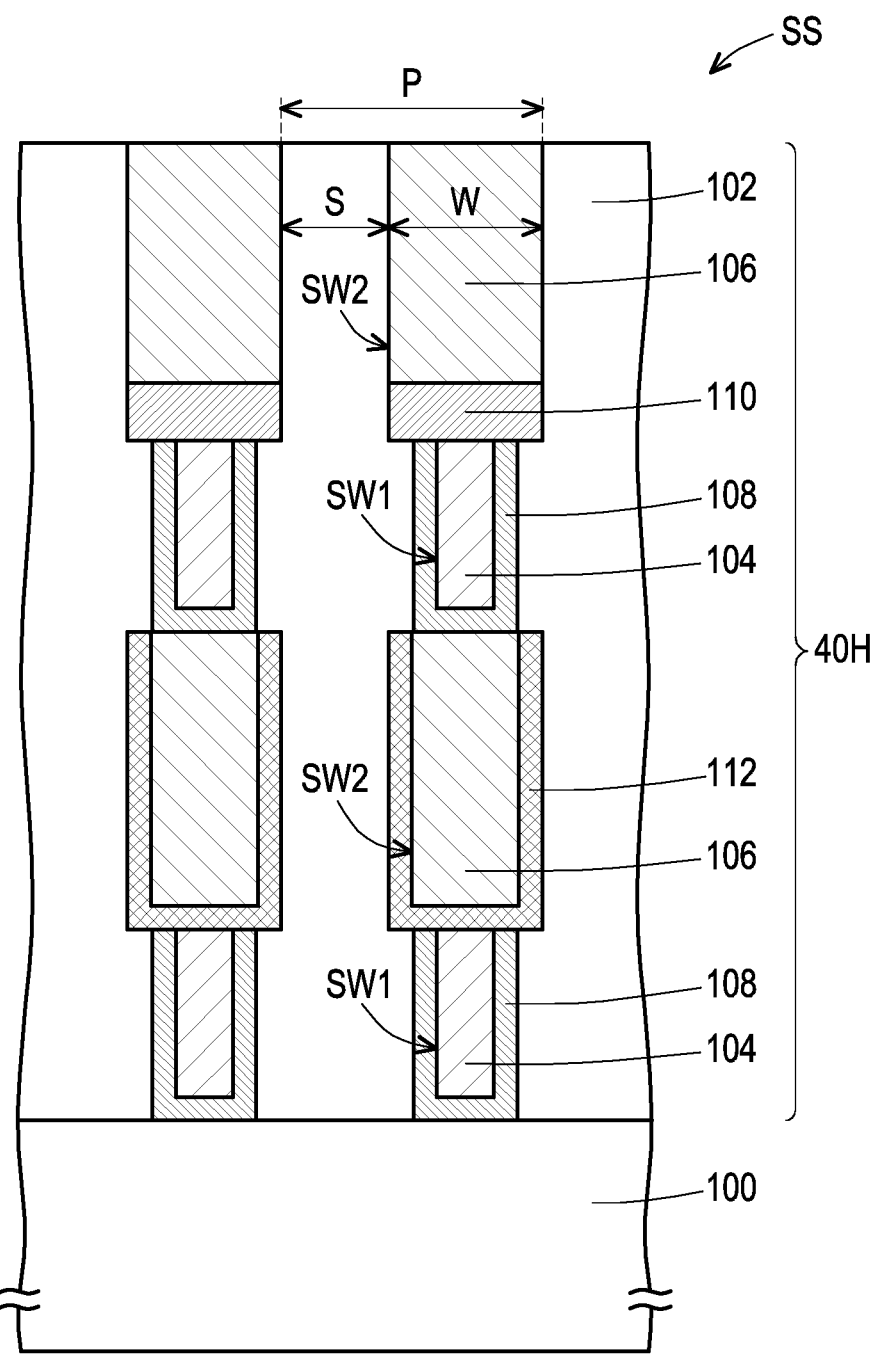
Figure 4I:
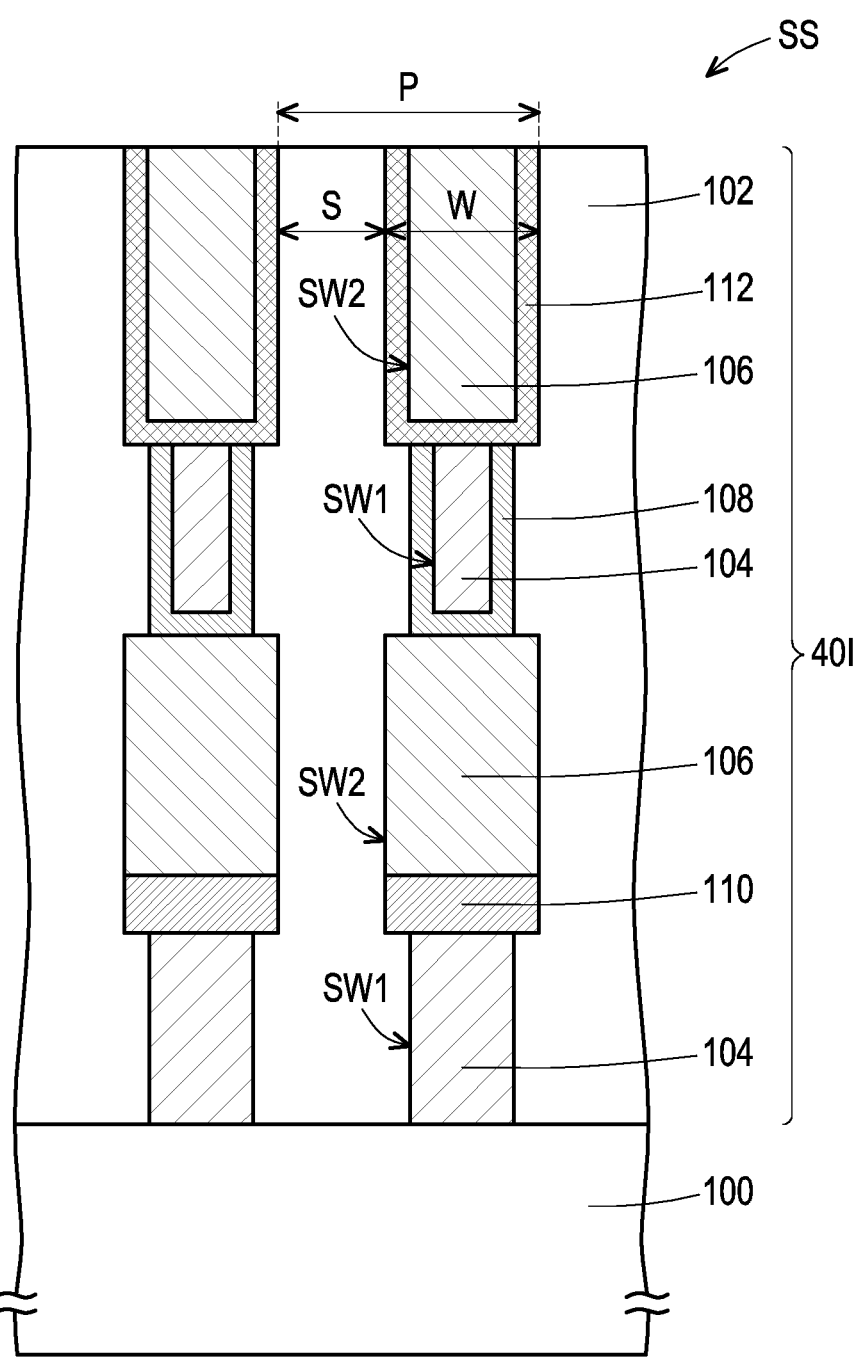
Figure 4J:
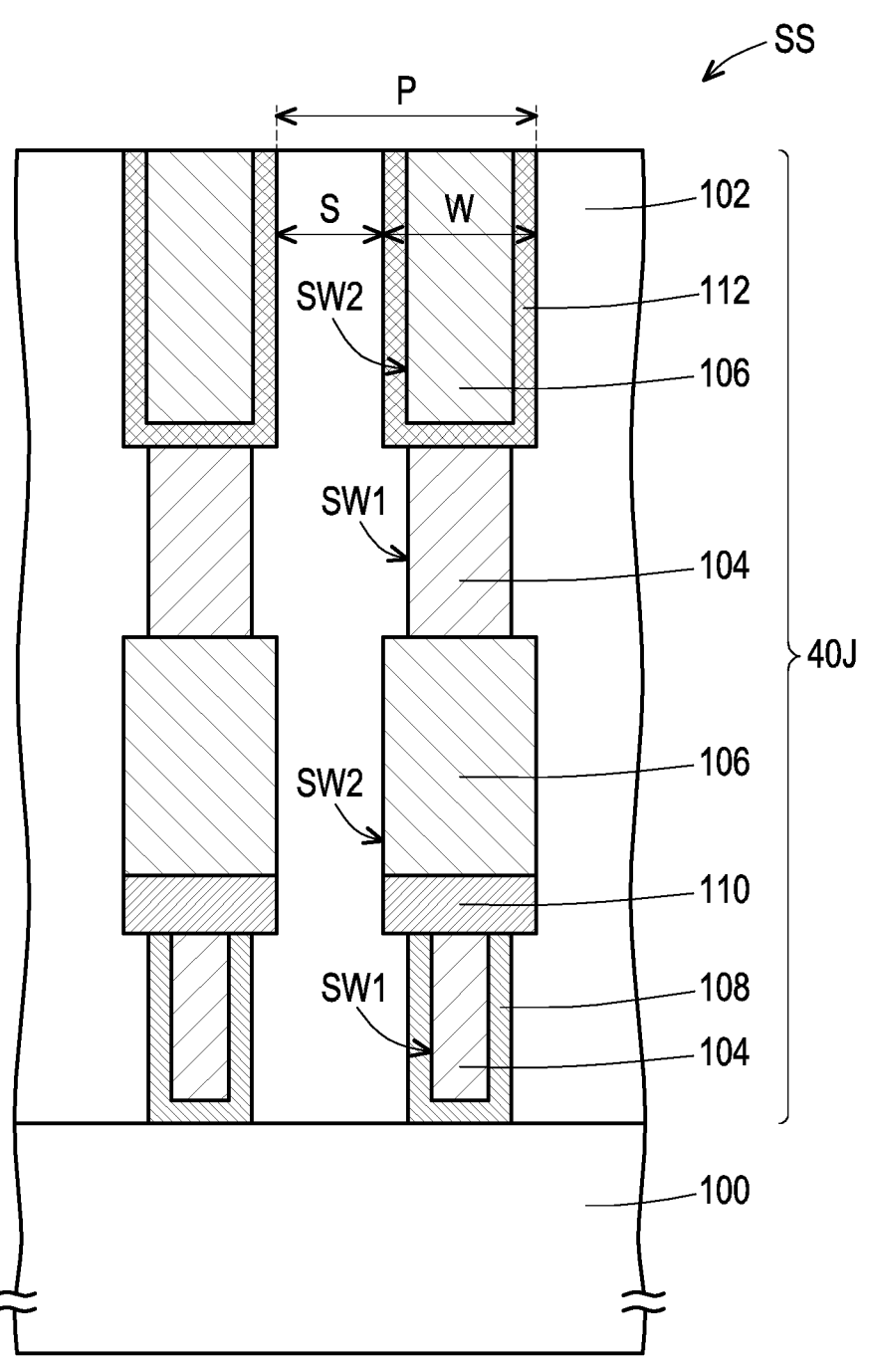
Figure 4K:
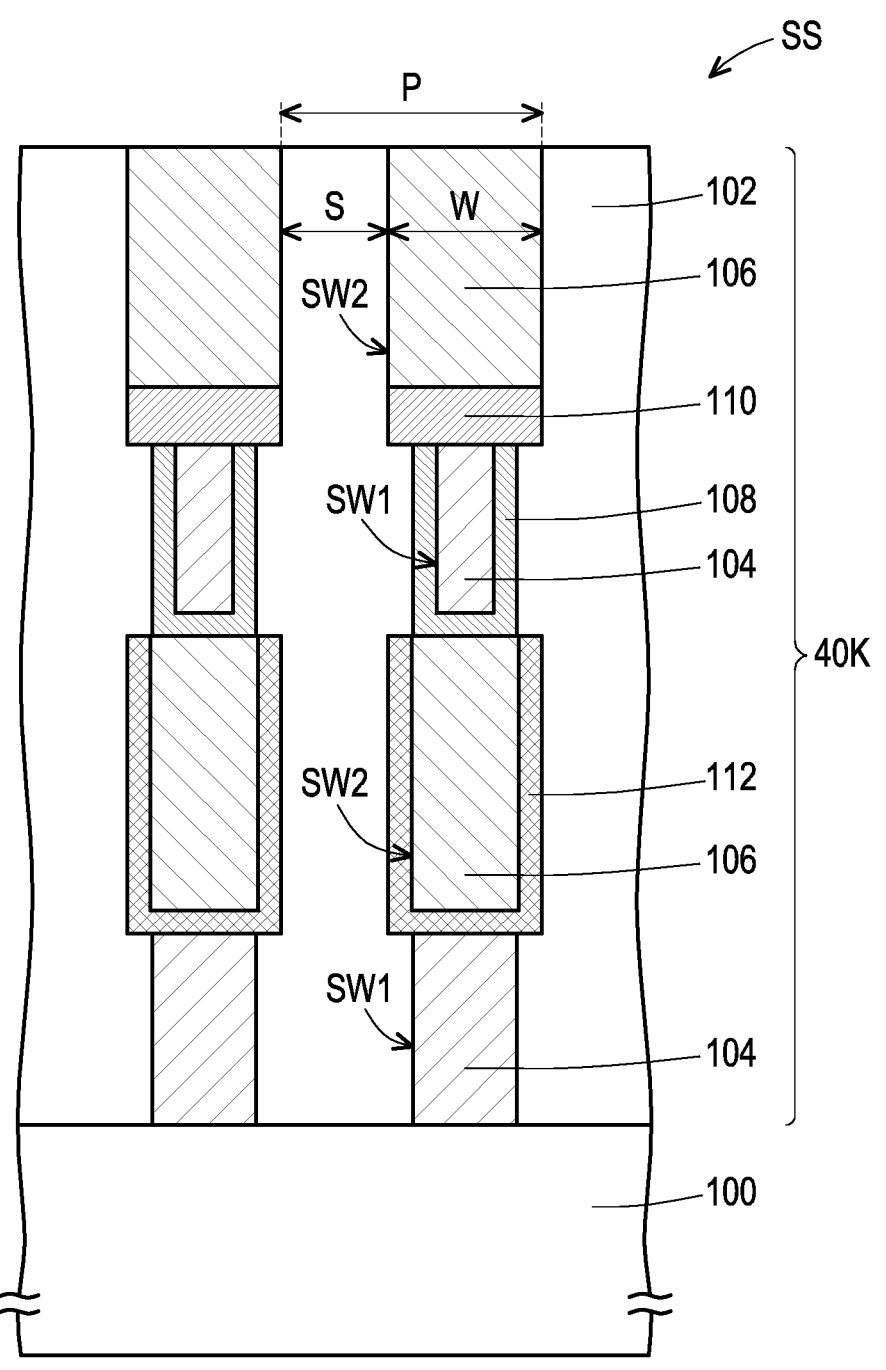
Figure 4L:
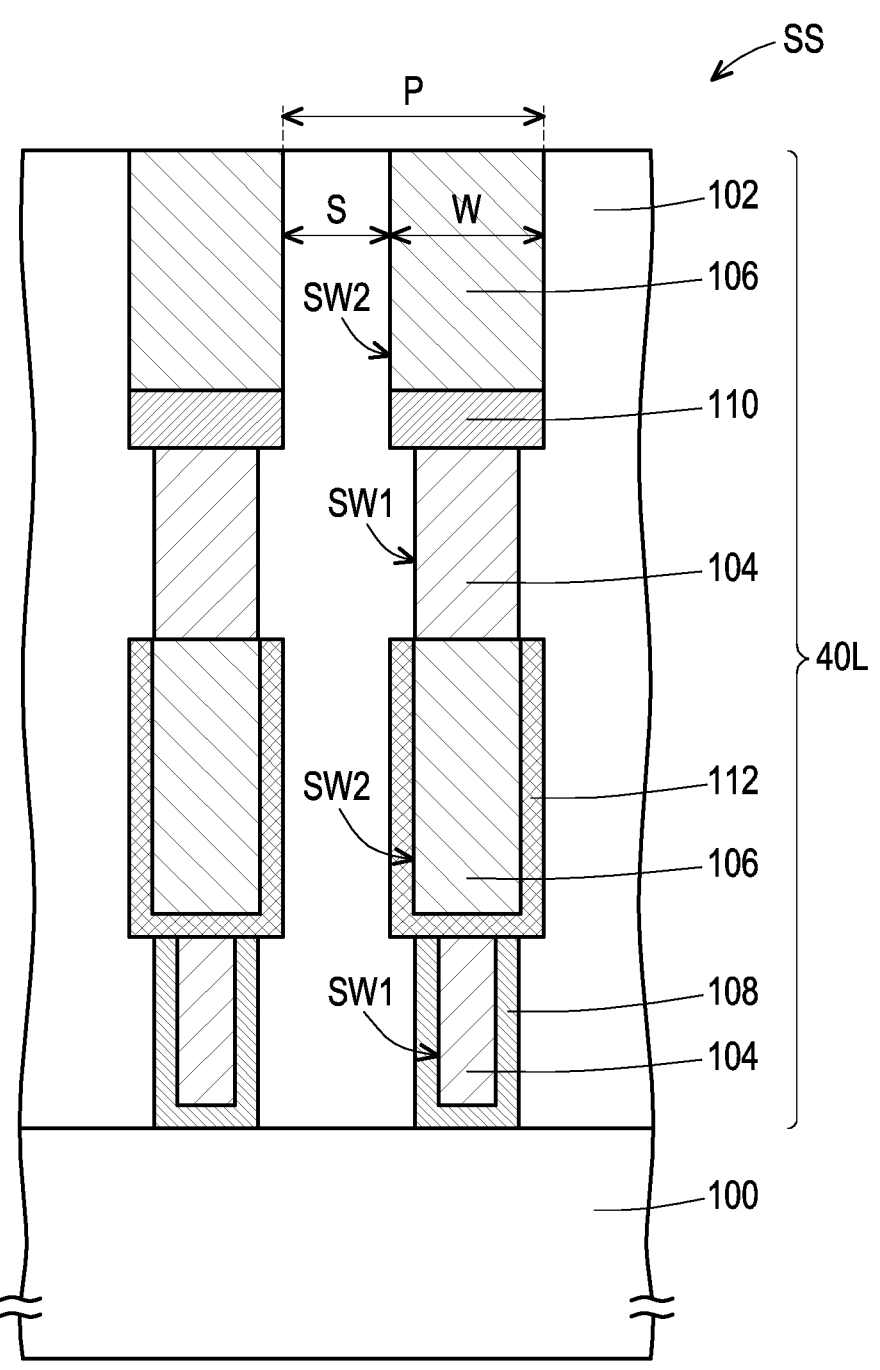

FIG. 3 is a cross-sectional view illustrating an interconnect structure according to other embodiments of the invention.

Referring to FIG. 1 and FIG. 3, the difference between an interconnect structure 30 of FIG. 3 and the interconnect structure 10 of FIG. 1 is as follows. The conductive lines 106 may include a conductive line 106A whose sidewall is in direct contact with the dielectric structure 102 and a conductive line 106B whose sidewall is not in direct contact with the dielectric structure 102. As long as the sidewall SW2 of at least one of the conductive lines 106 (e.g., conductive line 106A) is in direct contact with the dielectric structure 102, it falls within the scope of the invention.

The interconnect structure 30 may further include a barrier layer 112. The barrier layer 112 is disposed between the conductive line 106B whose sidewall is not in direct contact with the dielectric structure 102 and the dielectric structure 102, thereby isolating the sidewall SW2 of the conductive line 106B from the dielectric structure 102. In some embodiments, the barrier layer 112 may be further disposed directly below the conductive line 106B whose sidewall is not in direct contact with the dielectric structure 102. In some embodiments, the cross-sectional shape of the barrier layer 112 may be a U-shape. The material of the barrier layer 112 is, for example, tantalum (Ta), tantalum nitride (TaN), titanium (Ti), titanium nitride (TiN), ruthenium (Ru), titanium tungsten (TiW), tungsten nitride (WN), or a combination thereof.

In addition, in the interconnect structure 10 of FIG. 1 and the interconnect structure 30 of FIG. 3, the same or similar components are denoted by the same reference symbols, and the description thereof is omitted.

Based on the above embodiments, in the interconnect structure 30, the sidewall SW2 of at least one of the conductive lines 106 (e.g., conductive line 106A) is in direct contact with the dielectric structure 102. That is, there is no barrier layer between the sidewall SW2 of at least one of the conductive lines 106 (e.g., conductive line 106A) and the dielectric structure 102, so the conductive line 106 (e.g., conductive line 106A) whose sidewall is in direct contact with the dielectric structure 102 can have a larger line width, thereby effectively reducing the resistance of the conductive line 106 (e.g., conductive line 106A).

FIG. 4A to FIG. 4L are cross-sectional views illustrating interconnect structures according to other embodiments of the invention.

Referring to FIG. 4A to FIG. 4L, interconnect structures 40A to 40L may be obtained by adjusting the configuration of the barrier layer 108, the barrier layer 110, and the barrier layer 112 in the above embodiments. As long as the sidewall SW2 of at least one of the conductive lines 106 is in direct contact with the dielectric structure 102, it falls within the scope of the invention. In addition, in the interconnect structure 10 of FIG. 1, the interconnect structure 20 of FIG. 2, the interconnect structure 30 of FIG. 3, and the interconnect structures 40A to 40L of FIG. 4A to FIG. 4L, the same or similar components are denoted by the same reference symbols, and the description thereof is omitted.

Based on the above embodiments, in the interconnect structures 40A to 40L, the sidewall SW2 of at least one of the conductive lines 106 is in direct contact with the dielectric structure 102. That is, there is no barrier layer between the sidewall SW2 of at least one of the conductive lines 106 and the dielectric structure 102, so the conductive line 106 whose sidewall is in direct contact with the dielectric structure 102 can have a larger line width, thereby effectively reducing the resistance of the conductive line 106.

In summary, in the interconnect structure of the aforementioned embodiment, since the sidewall of at least one of the conductive lines is in direct contact with the dielectric structure, there is no barrier layer between the sidewall of at least one of the conductive lines and the dielectric structure. In this way, the conductive line whose sidewall is in direct contact with the dielectric structure can have a larger line width, thereby effectively reducing the resistance of the conductive line.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An interconnect structure, comprising:

a dielectric structure disposed on a substrate;

plugs disposed in the dielectric structure; and conductive lines disposed in the dielectric structure and electrically connected to the plugs, wherein a sidewall of at least one of the conductive lines is in direct contact with the dielectric structure, a minimum pitch of the interconnect structure is less than 54 nm, a line width of the at least one of the conductive lines is less than 22 nm, and a material of the at least one of the conductive lines is molybdenum or cobalt.

2. The interconnect structure according to claim 1, wherein the plugs and the conductive lines are alternately stacked on the substrate.

3. The interconnect structure according to claim 1, wherein the dielectric structure comprises a multilayer structure.

4. The interconnect structure according to claim 1, wherein a sidewall of at least one of the plugs is in direct contact with the dielectric structure.

5. The interconnect structure according to claim 1, wherein sidewalls of all the plugs are in direct contact with the dielectric structure.

6. The interconnect structure according to claim 1, wherein a sidewall of at least one of the plugs is in direct contact with the dielectric structure, and a material of the at least one of the plugs comprises ruthenium, tungsten, or palladium.

7. The interconnect structure according to claim 1, wherein a sidewall of at least one of the plugs is not in direct contact with the dielectric structure, and a material of the at least one of the plugs comprises copper, cobalt, ruthenium, tungsten, or palladium.

8. The interconnect structure according to claim 1, further comprising:

a barrier layer disposed between at least one of the plugs and the dielectric structure.

9. The interconnect structure according to claim 8, wherein the barrier layer is further disposed directly below the at least one of the plugs, and a cross-sectional shape of the barrier layer comprises a U-shape.

10. The interconnect structure according to claim 8, wherein a material of the barrier layer comprises tantalum, tantalum nitride, titanium, titanium nitride, ruthenium, or a combination thereof.

11. The interconnect structure according to claim 1, further comprising:

a barrier layer disposed between the at least one of the conductive lines and at least one of the plugs.

12. The interconnect structure according to claim 11, wherein a cross-sectional shape of the barrier layer comprises a linear shape.

13. The interconnect structure according to claim 11, wherein a material of the barrier layer comprises tantalum, tantalum nitride, titanium, titanium nitride, ruthenium, titanium tungsten, tungsten nitride, or a combination thereof.

14. The interconnect structure according to claim 1, wherein the sidewalls of all the conductive lines are in direct contact with the dielectric structure.

15. The interconnect structure according to claim 1, wherein the conductive lines comprise a conductive line whose sidewall is not in direct contact with the dielectric structure.

16. The interconnect structure according to claim 15, further comprising:

a barrier layer disposed between the conductive line whose sidewall is not in direct contact with the dielectric structure and the dielectric structure.

17. The interconnect structure according to claim 16, wherein the barrier layer is further disposed directly below the conductive line whose sidewall is not in direct contact with the dielectric structure, and a cross-sectional shape of the barrier layer comprises a U-shape.

18. The interconnect structure according to claim 16, wherein a material of the barrier layer comprises tantalum, tantalum nitride, titanium, titanium nitride, ruthenium, titanium tungsten, tungsten nitride, or a combination thereof.

* * * * *